United States Patent
Ngo et al.

(10) Patent No.: US 6,724,252 B2
(45) Date of Patent: Apr. 20, 2004

(54) SWITCHED GAIN AMPLIFIER CIRCUIT

(75) Inventors: David Q. Ngo, Phoenix, AZ (US);
Mike B. Thomas, Chandler, AZ (US);
Christopher B. Foye, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 82 days.

(21) Appl. No.: 10/080,187

(22) Filed: Feb. 21, 2002

(65) Prior Publication Data

US 2003/0155972 A1 Aug. 21, 2003

(51) Int. Cl.[7] ............... H03G 9/00; H03G 3/20; H03G 5/16; H03F 1/14
(52) U.S. Cl. ............ 330/133; 330/51; 330/129; 330/134
(58) Field of Search ............ 330/51, 129, 133, 330/134

(56) References Cited

U.S. PATENT DOCUMENTS

| | | | |
|---|---|---|---|
| 4,446,440 A | * 5/1984 | Bell | 330/10 |
| 4,701,957 A | * 10/1987 | Smith | 381/61 |
| 4,739,759 A | 4/1988 | Rexroth et al. | 128/303.14 |
| 5,251,330 A | 10/1993 | Chiba et al. | 455/91 |
| 5,276,917 A | 1/1994 | Vanhanen et al. | 455/89 |
| 5,438,683 A | 8/1995 | Durtler et al. | 455/74 |
| 5,442,322 A | 8/1995 | Kornfeld et al. | 330/285 |
| 5,493,255 A | 2/1996 | Murtojarvi | 330/296 |
| 5,511,234 A | 4/1996 | Ha | 455/127 |
| 5,530,404 A | 6/1996 | Debroux | 330/278 |
| 5,530,923 A | * 6/1996 | Heinonen et al. | 455/126 |
| 5,559,471 A | 9/1996 | Black | 330/277 |
| 5,561,395 A | 10/1996 | Melton et al. | 330/2 |
| 5,606,284 A | 2/1997 | Tamesue et al. | 330/129 |
| 5,715,527 A | 2/1998 | Horii et al. | 455/126 |
| 5,831,477 A | 11/1998 | Tsumura | 330/51 |
| 5,834,975 A | 11/1998 | Bartlett et al. | 330/278 |
| 5,861,776 A | 1/1999 | Swanson | 330/124 R |
| 5,862,461 A | 1/1999 | Yoshizawa et al. | 455/127 |
| 5,872,481 A | 2/1999 | Sevic et al. | 330/51 |
| 5,942,946 A | 8/1999 | Su et al. | 330/310 |
| 5,994,963 A | 11/1999 | Kawai et al. | 330/277 |
| 6,025,753 A | 2/2000 | Landherr et al. | 330/285 |
| 6,049,704 A | 4/2000 | Peckham et al. | 455/232.1 |
| 6,148,220 A | 11/2000 | Sharp et al. | 455/572 |
| 6,188,877 B1 | * 2/2001 | Boesch et al. | 455/74 |
| 6,327,462 B1 | 12/2001 | Loke et al. | 455/127 |
| 6,356,745 B1 | 3/2002 | Lee et al. | 455/232.1 |
| 6,369,649 B2 | 4/2002 | Nakajima | 330/51 |
| 6,374,127 B1 | 4/2002 | Park | 455/572 |
| 6,397,090 B1 | 5/2002 | Cho | 455/574 |
| 6,405,054 B1 | 6/2002 | Rozenblit et al. | 455/522 |
| 2001/0006355 A1 | 7/2001 | Park | 330/285 |
| 2002/0002038 A1 | 1/2002 | Seawright et al. | 455/127 |
| 2002/0077066 A1 | 6/2002 | Pehike et al. | 455/73 |
| 2002/0127980 A1 | 9/2002 | Amanullah et al. | 455/127 |
| 2003/0083026 A1 | 5/2003 | Liu | 455/127 |
| 2003/0090325 A1 | 5/2003 | Canyon et al. | 330/285 |

FOREIGN PATENT DOCUMENTS

| | | |
|---|---|---|
| JP | 61095603 | 5/1986 |
| JP | 5235657 | 9/1993 |

* cited by examiner

*Primary Examiner*—Patricia Nguyen
(74) *Attorney, Agent, or Firm*—Withrow & Terranova, PLLC

(57) ABSTRACT

An amplifier chain that switches between a saturated mode of operation and a linear mode of operation comprises at least two amplifier stages. A switch is associated with the first amplifier stage and dampens the gain of the amplifier chain when the switch is closed. In a first embodiment, this is done by bypassing the first amplifier stage. In second and third embodiments, this is done by providing a feedback loop to the first amplifier stage. Dynamic device scaling and changing the bias may also be used to affect the performance of the amplifier chain.

36 Claims, 6 Drawing Sheets

SWITCHED GAIN AMPLIFIER CIRCUIT

FIELD OF THE INVENTION

The present invention relates to an improvement for an amplifier, and particularly to an amplifier circuit that operates in both a saturated and a linear mode.

BACKGROUND OF THE INVENTION

Power amplifiers see usage in many different areas of everyday life. One of the more common applications is in increasingly ubiquitous mobile terminals, such as cellular phones, personal digital assistants, and the like. In such devices, an amplifier chain is usually positioned immediately prior to an antenna and boosts a signal for wireless transmission to a base station.

Careful control must be exercised over the amplification so as to avoid adjacent channel interference. This is done in part through power control signals sent by base stations to the mobile terminals. However, such arrangements leave the actual power control to the mobile terminal, which must boost the power at the desired frequencies while suppressing leakage into other frequencies.

Recent years have seen an increase in the number of mobile terminals. Coupled to this increase was a demand for more bandwidth in which these mobile terminals could operate. To that end, various government entities set aside additional bandwidth in the electromagnetic spectrum. However, this bandwidth is not contiguous to the original cellular bandwidth. Still further complicating the matter are the various digital and analog standards that may be present within the various bandwidths. As yet another problem, not every nation has the same bandwidths set aside for the same standards. While recent efforts at harmonization have seen some improvement, the fact remains that many legacy systems are still existent and require mobile terminals that operate in two or three different bands or modes of operation. Even where the bandwidth is well settled, there are also evolving modulation schemes within a given bandwidth. The newer modulation schemes allow more information to be transmitted over the wireless communication link.

What may be an effective amplification scheme in a first mode of operation may be inefficient or undesirable in a second mode of operation. Duplication of amplifier chains is wasteful not only of components, but also of valuable space within the mobile terminals that are being designed to be smaller with each iteration. Newer modulation schemes may require different amplification schemes than the older modulation schemes.

Thus a need remains for an amplifier circuit that can switch between modes effectively while still providing the desired amplification.

SUMMARY OF THE INVENTION

The present invention provides at least three techniques by which a power amplifier chain may be switched between different modes of operation. The power amplifier chain, in an exemplary embodiment, comprises three amplifier stages arranged in series. The first amplifier stage is associated with a switch.

In a first embodiment, when the switch is open, each amplifier stage of the amplifier chain operates in a saturated mode. When the switch is closed, the bias on the remaining two stages is increased, thereby increasing the gain supplied by the remaining two stages. Further, the closed switch creates a short around the first amplifier stage, allowing the remaining two amplifier stages to operate in a linear mode.

In a second embodiment, when the switch is open, each amplifier stage of the amplifier chain operates in a saturated mode. When the switch is closed, a feedback loop is created around the first amplifier stage, thereby reducing the gain of the first amplifier stage. The bias on at least the remaining two stages is increased, and the amplifiers in the chain may operate in a linear mode.

In a third embodiment, the feedback loop of the second embodiment is present and the bias on the stages is varied. Further, the third amplifier stage comprises a plurality of transistors operating in parallel, some of which are dynamically taken in and out of use so as to control the gain of the last amplifier stage.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
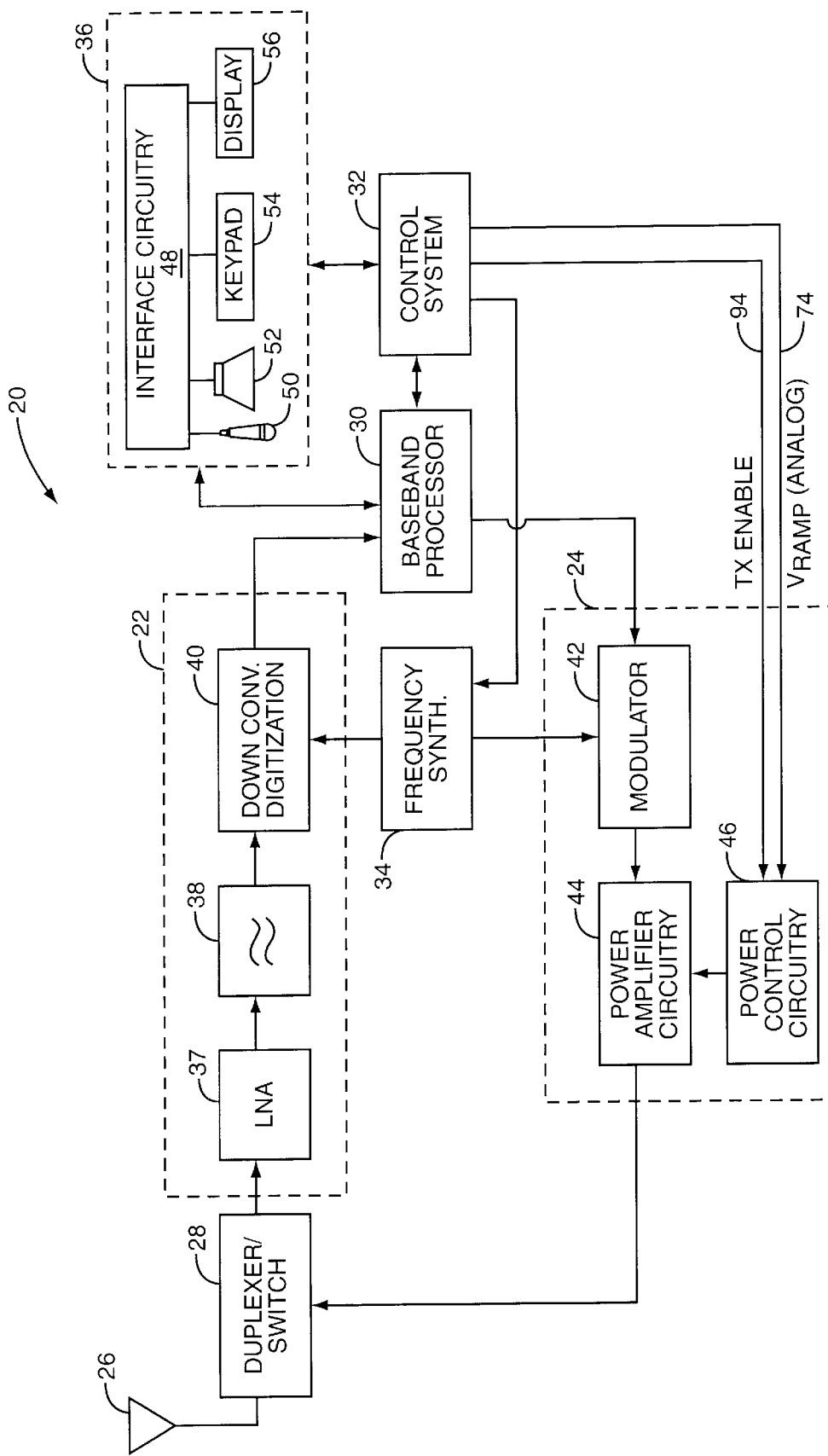
FIG. 1 is a schematic drawing of a mobile terminal constructed according to the present invention.

The present invention is preferably incorporated in a mobile terminal 20, such as a mobile telephone, personal digital assistant, or the like. The basic architecture of a mobile terminal 20 is represented in FIG. 1 and may include a receiver front end 22, a radio frequency transmitter section 24, an antenna 26, a duplexer or switch 28, a baseband processor 30, a control system 32, a frequency synthesizer 34, and an interface 36. The receiver front end 22 receives information bearing radio frequency signals from one or more remote transmitters provided by a base station (not shown). A low noise amplifier 37 amplifies the signal. A filter circuit 38 minimizes broadband interference in the received signal, while a downconverter 40 downconverts the filtered, received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data from the control system 32, which it encodes for transmission. The encoded data is output to the transmitter 24, where it is used by a modulator 42 to modulate a carrier signal that is at a desired transmit frequency. Power amplifier circuitry 44 amplifies the modulated carrier signal to a level appropriate for transmission from the antenna 26.

As described in further detail below, the power amplifier circuitry 44 provides gain for the signal to be transmitted under control of the power control circuitry 46, which is preferably controlled by the control system 32.

A user may interact with the mobile terminal 20 via the interface 36, which may include interface circuitry 48 associated with a microphone 50, a speaker 52, a keypad 54, and a display 56. The interface circuitry 48 typically includes analog-to-digital converters, digital-to-analog converters, amplifiers, and the like. Additionally, it may include a voice encoder/decoder, in which case it may communicate directly with the baseband processor 30.

The microphone 50 will typically convert audio input, such as the user's voice, into an electrical signal, which is then digitized and passed directly or indirectly to the baseband processor 30. Audio information encoded in the received signal is recovered by the baseband processor 30, and converted into an analog signal suitable for driving speaker 52 by the interface circuitry 48. The keypad 54 and display 56 enable the user to interact with the mobile terminal 20, input numbers to be dialed, address book information, or the like, as well as monitor call progress information.

Figure 2:
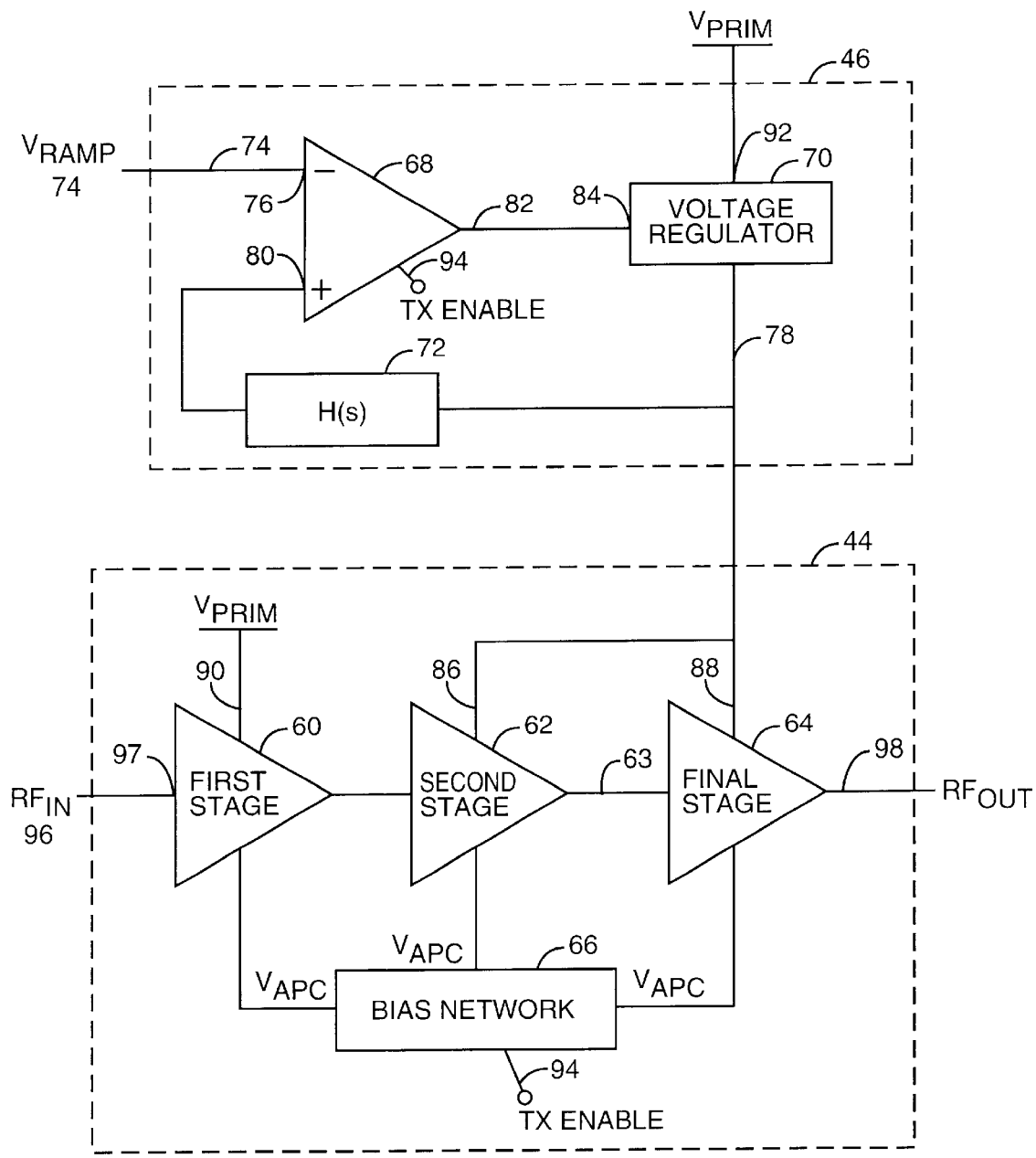
FIG. 2 is a schematic drawing of a power amplifier chain used in a mobile terminal.

While a detailed discussion of amplifier chains may be found in commonly owned U.S. patent application Ser. No. 09/878,461, filed Jun. 11, 2001, the disclosure of which is hereby incorporated by reference, the following outlines the basic operation of a multistage amplifier. Turning now to FIG. 2, the power amplifier circuitry 44 is associated with power control circuitry 46. The power amplifier circuitry 44 may comprise three amplifier stages, a first amplifier stage 60, a second amplifier stage 62, and a third amplifier stage 64, as well as a bias network 66 providing bias for each of the three amplifier stages 60, 62, and 64. In alternate embodiments, bias network 66 may comprise multiple bias networks, one each for each amplifier stage. Other arrangements are also possible. The power control circuitry 46 will preferably include an error amplifier 68, a voltage regulator 70, and a feedback network 72 having a transfer function H(s).

As described above, the power amplifier circuitry 44 provides gain for the signal to be transmitted under control of the power control circuitry 46. Control system 32 uses a $V_{RAMP}$ signal 74. Preferably, the bias for the amplifier circuitry 44 is relatively stable regardless of power, and varying the voltage supplied to the amplifier circuitry 44 controls actual power levels.

The adjustable power control signal 74 ($V_{RAMP}$) may be received by a negative input 76 of an operational amplifier forming error amplifier 68. The regulated output 78 of the voltage regulator 70 is fed back through the feedback network 72 and received by positive input 80 of error amplifier 68. An output signal 82 from error amplifier 68 is provided to a control input 84 of the voltage regulator 70 that controls the regulated output 78 of voltage regulator 70. The voltage regulator 70 regulates the voltage supplied to the rails 86, 88 of the second and third amplifier stages 62, 64, respectively. These rails 86, 88 will typically be the collectors of bipolar transistors or drains of field effect transistors forming the respective amplifier stages, as will be appreciated by those skilled in the art.

The rail 90 of first amplifier stage 60 is connected directly to a fixed or primary voltage supply $V_{PRIM}$, which will preferably be connected to the terminal for the positive potential of a battery. $V_{PRIM}$ is also preferably connected to voltage regulator input terminal 92. As noted, the bias network 66 supplies a fixed bias to the three power amplifier stages 60, 62, 64, regardless of the collector/drain voltage supplied to the second and third amplifier stages 62, 64. The fixed bias incorporates traditional $V_{APC}$ signals, which are configured to maintain a constant bias.

A transmit enable signal 94, TX ENABLE, is a logic signal used to simultaneously enable or disable the error amplifier 68 and the amplifier circuitry 44 by removing the bias from each of the three amplifier stages 60, 62, 64. A radio frequency signal 96 ($RF_{IN}$) to be amplified is provided at the input 97 of the first stage amplifier 60 and amplified by the three amplifier stages 60, 62, 64 to provide an amplified output signal 98 ($RF_{OUT}$) from the third amplifier stage 64.

While three amplifier stages are preferred, other arrangements of two, four, or more are contemplated. The teachings of the present invention apply to such arrangements, and one of ordinary skill in the art can modify the present teachings to such arrangements.

In FIG. 2, each amplifier stage 60, 62, and 64 is shown as a discrete element. Certain advantages may be realized by forming an amplifier stage from a plurality of transistor cells arranged in parallel. In an exemplary embodiment, the first amplifier stage 60 comprises a single transistor cell; the second amplifier stage 62 comprises approximately six transistor cells; and the final amplifier stage 64 comprises forty-eight transistor cells.

For further information pertaining to the transistor arrays, reference is made to U.S. Pat. No. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entirety. Still further information may be found in commonly owned U.S. patent application Ser. No. 09/952,524, filed Sep. 14, 2001, the disclosure of which is hereby incorporated by reference. Exemplary bias networks 66 capable of being used in association with the present invention are described in further detail in U.S. patent application Ser. No. 09/467,415, entitled BIAS NETWORK FOR HIGH EFFICIENCY RF LINEAR POWER AMPLIFIER, filed Dec. 20, 1999, currently pending, the disclosure of which is incorporated herein by reference in its entirety. Upon understanding the present invention, those skilled in the art will be able to construct any number of bias networks that are compatible with the present invention.

Figure 3:
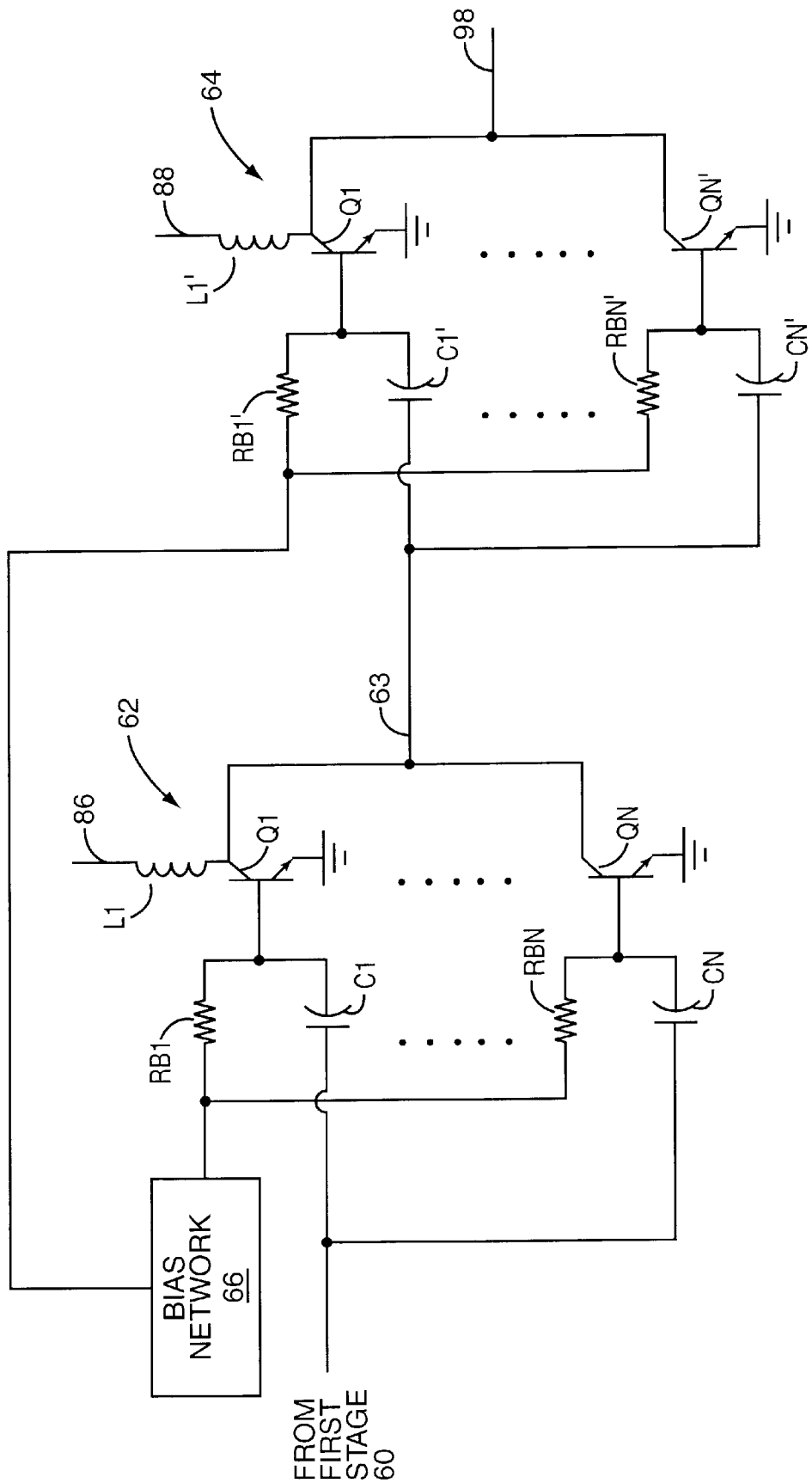
FIG. 3 is a schematic drawing of amplifier stages, each with a transistor array associated therewith such as may be used with the present invention.

With reference to FIG. 3, amplifier stages 62 and 64 are illustrated using transistor cells. A transistor cell is essentially a transistor, a resistor and a capacitor, such as Q1, RB1, and C1. The amplifier stage 62 is comprised of a transistor network formed by transistors Q1 to QN. In this configuration, each transistor Q1 through QN receives identical bias from the bias network 66 through resistors RB1 through RBN. Output from the first amplifier stage 60 comes into the second amplifier stage 62 and drives the transistor array through capacitors C1 through CN. Notably, the collectors of transistors Q1 through QN are coupled together to provide a common output signal 63.

Output signal 63 from second amplifier stage 62 is directed to final amplifier stage 64. The final amplifier stage 64 is comprised of a transistor network formed by transistors Q1' to QN'. In this configuration, each transistor Q1' through QN' receives identical bias from the bias network 66 through the resistors RB1' through RBN'. Output signal 63 from the second amplifier stage 62 comes into the final amplifier stage 64 and drives the transistor array through capacitors C1' through CN'. Notably, the collectors of transistors Q1' through QN' are coupled together to provide a common output signal 98. The transistors Q1 through QN and Q1' through QN' are preferably heterojunction bipolar transistors (HBTs) formed on a single semiconductor and equally sized to form a transistor array. However, the inventive concepts defined herein are independent of technology (Si, GaAs, SiGe, etc.) as well as device type (BJT, FET, MESFET, HBT, etc.). Further, the number of transistors in each array need not be the same. Thus N does not necessarily equal N', although it may if needed or desired. In an exemplary embodiment, N=6 and N'=48.

The present invention builds on the amplifier chain technology of that previously discussed by allowing switching between modes. The switching may use one of several techniques, illustrated in FIGS. 4–6. In an exemplary embodiment, the amplifier chain switches from operation in a Gaussian prefiltered Minimum Shift Keying (GMSK) mode to operation in an 8-PSK (phase shift keying) mode for the newly developed Enhanced Data Rate for GSM Evolution (EDGE). The arrangements provide higher efficiency for the 8-PSK mode, a potential improvement in noise power in the 8-PSK mode, and higher gain in the GMSK mode so as to support a low input drive. Further, a lower gain is available in the 8-PSK mode to avoid distortion.

Figure 4:
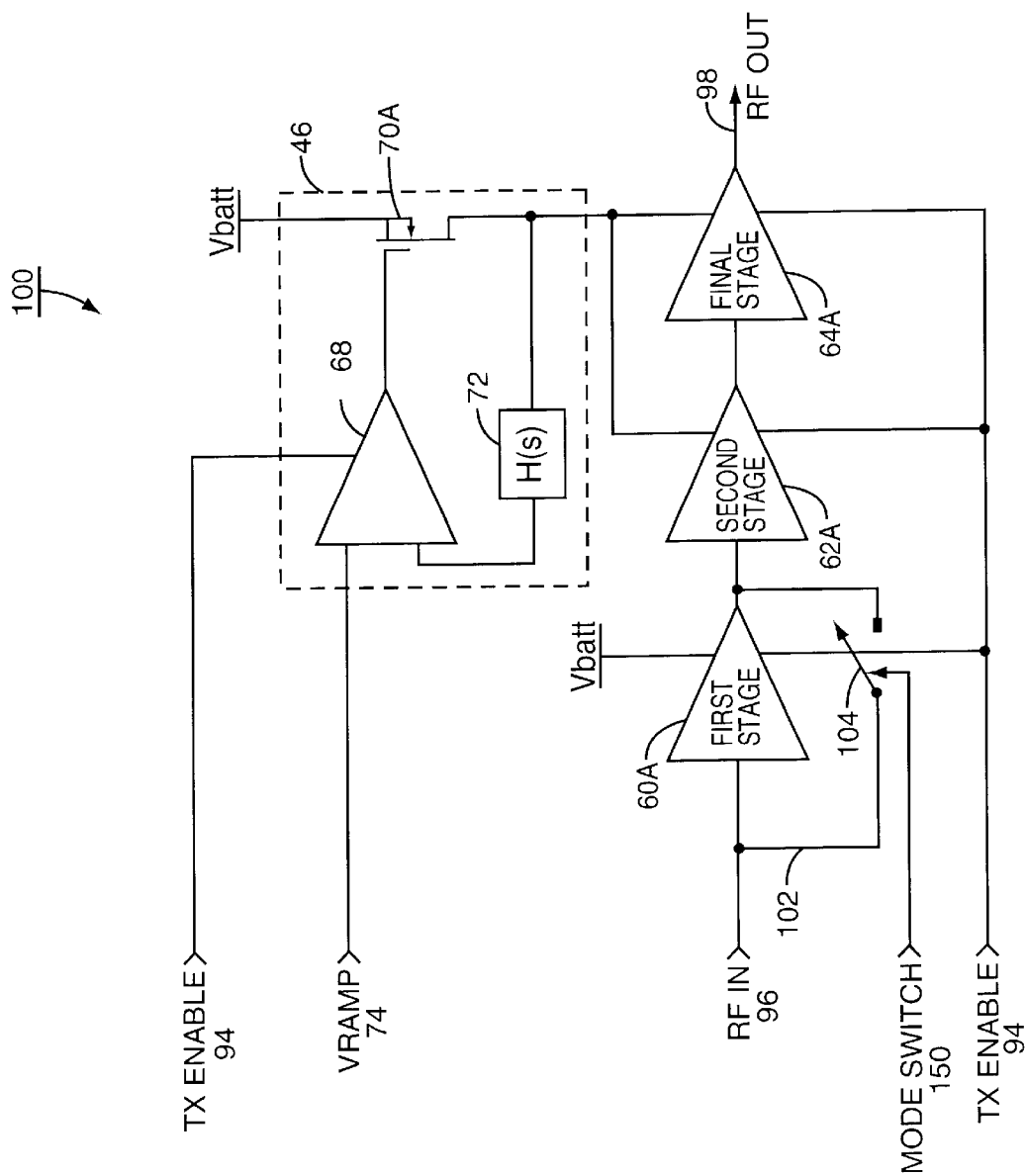
FIG. 4 is a schematic drawing of a first embodiment of the present invention.

FIG. 4 illustrates a first embodiment of the present invention in which an amplifier chain 100 is comprised of first amplifier stage 60A, second amplifier stage 62A, and final amplifier stage 64A. Power control circuitry 46 remains essentially unchanged from that described earlier, although the voltage regulator 70 is explicitly a FET 70A. The amplifier chain 100 has a bypass link 102 around first amplifier stage 60A. The bypass link 102 comprises a switch 104, which is controlled by a mode switch signal 150. The mode switch signal may be a logical low to instruct the switch 104 to open. In an exemplary embodiment, the switch 104 is a pin diode switch. In an alternate embodiment, the switch 104 may be a transistor or the like. When the switch 104 is open, the amplifier chain 100 operates as would be expected. Namely, an RF input signal 96 is amplified in first amplifier stage 60A, second amplifier stage 62A, and final amplifier stage 64A prior to being sent through a matching network and thence to the antenna 26 (FIG. 1). The switch 104 is open in a first mode of operation, typically the GMSK mode of operation. The amplifier stages 60A, 62A, 64A are operated in a saturated mode. In this mode, the RF input might be at +2 dBm (fixed) and an output power of +35 dBm. Small signal gain might be on the order of +40 dB.

The switch 104 is closed in a second mode of operation, such as the 8-PSK mode of operation. Mode switch signal 150 may be a logical high to instruct the switch 104 to close. When the switch 104 is closed, a short circuit is created around the first amplifier stage 60A, and it is bypassed. Thus, the RF input signal 96 is presented to the input of second amplifier stage 62A without the amplification of the first amplifier stage 60A. In conjunction with the switch 104 being closed, the bias supplied by the bias network 66 (FIG. 2) is increased sufficiently for the amplifier stages 62A and 64A to operate in a linear mode rather than a saturated mode. In an exemplary embodiment, the bias voltage increases from approximately 2.6 V to 2.85 V. This embodiment has the advantage that it has better efficiency in the 8-PSK mode than previous efforts at both full and back-off power due to lower quiescent currents and the removal of the first amplifier stage 60A.

Note that the actual opening and closing of the switch 104 does not change the mode of operation from saturated to linear or vice versa. Instead, the switch 104 is operated so that the amplifier chain 100 may function better in the desired mode. Further, it should be appreciated that the bypass link 102 and the switch 104 may be repositioned within the amplifier chain 100 such that any amplifier stage may be bypassed or dampened in this manner.

Figure 5:
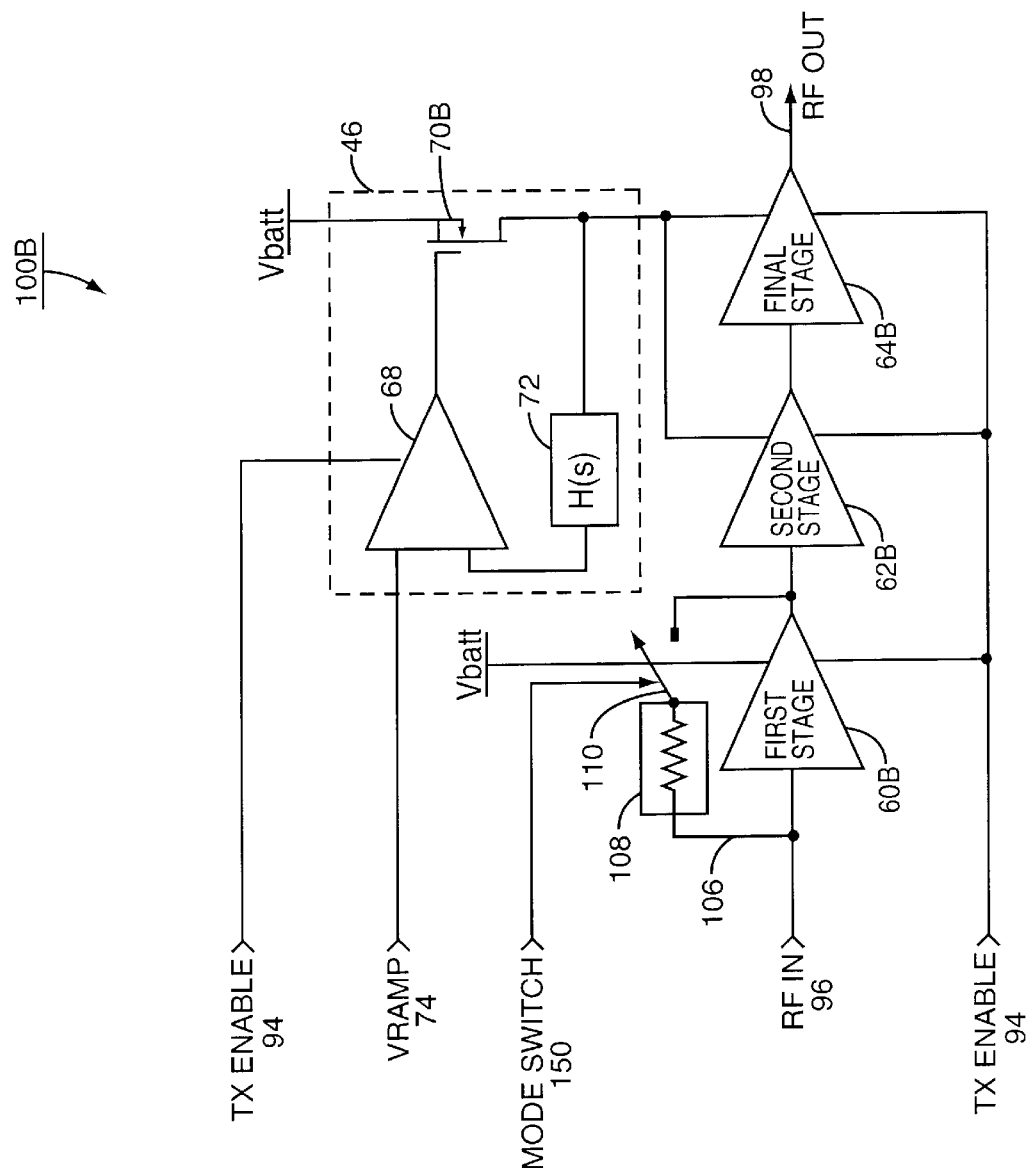
FIG. 5 is a schematic drawing of a second embodiment of the present invention.

A second embodiment is illustrated in FIG. 5. Amplifier chain 100B comprises first amplifier stage 60B, second amplifier stage 62B, and final amplifier stage 64B. Power control circuitry 46 remains essentially unchanged from that described earlier, although the voltage regulator 70 is explicitly a FET 70B. The amplifier chain 100B has a feedback loop 106 around first amplifier stage 60B. The feedback loop 106 comprises a feedback element 108 and a switch 110. The feedback element 108 may comprise a resistor or other impedance inducing element such as an inductor or the channel resistance of a transistor functioning as the switch 110. When the switch 110 is open, the amplifier chain 100B operates as would be expected. Namely, an RF input signal 96 is amplified in first amplifier stage 60B, second amplifier stage 62B, and final amplifier stage 64B prior to being sent through a matching network and thence to the antenna 26 (FIG. 1). The switch 110 is open in a first mode of operation, such as the GMSK mode of operation, wherein the amplifier stages 60B, 62B, 64B are operated in a saturated mode.

The switch 110 is closed in a second mode of operation, such as the 8-PSK mode of operation. When the switch 110 is closed, feedback loop 106 is created around the first amplifier stage 60B, thereby decreasing the gain achieved in the first amplifier stage 60B. In conjunction with the switch 110 being closed, the bias supplied by the bias network 66 (FIG. 2) is increased, and the amplifier stages 60B, 62B and 64B are operated in a linear mode rather than a saturated mode.

While the embodiment of FIG. 5 does not necessarily improve the noise power or the efficiency of the amplifier chain 100B over a typical amplifier chain, it does have the advantage that it is easy to design and implement and allows the multimodal operation desired.

Figure 6:
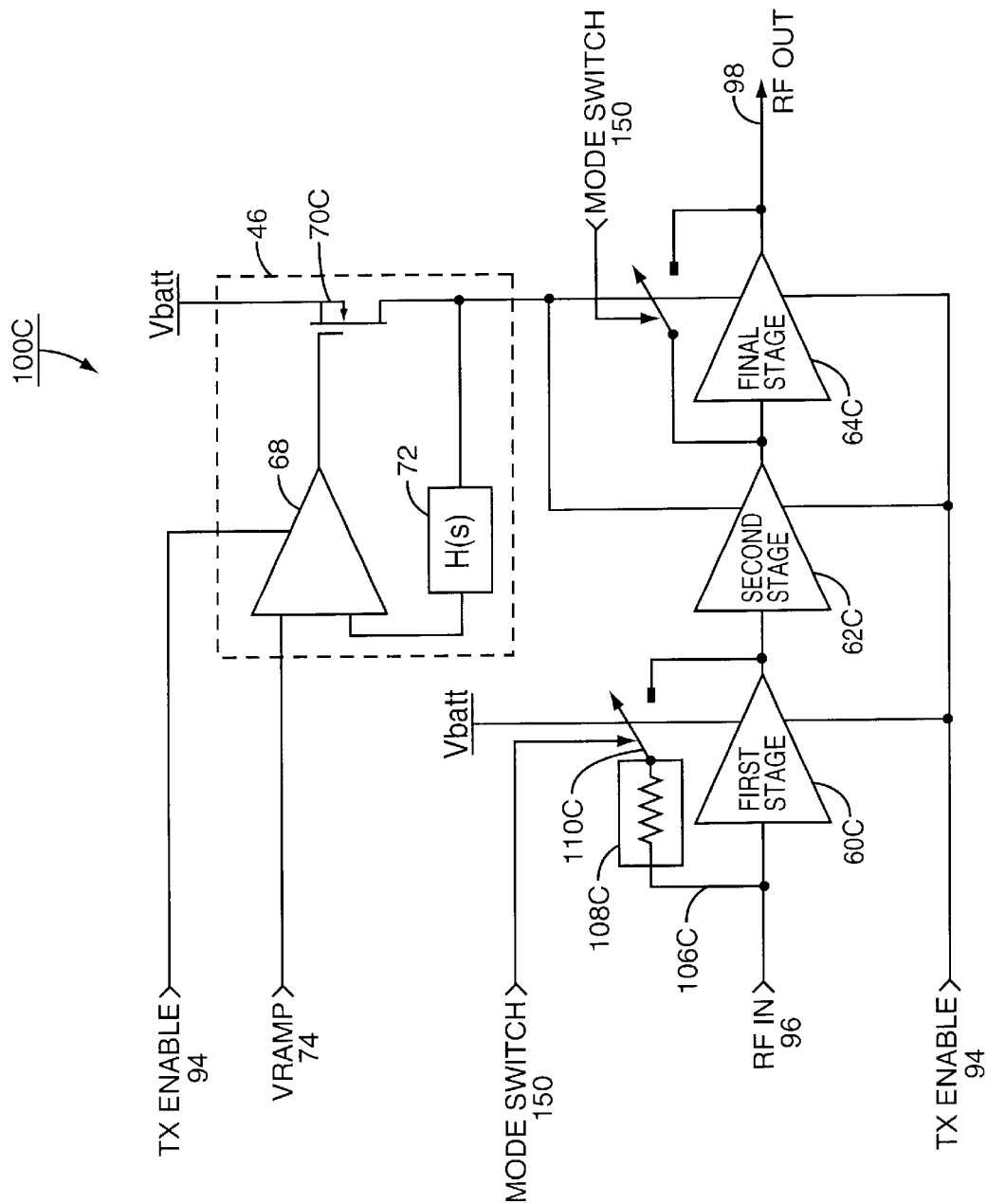
FIG. 6 is a schematic drawing of a third embodiment of the present invention.

A third embodiment is illustrated in FIG. 6, wherein an amplifier chain 100C comprises first amplifier stage 60C, second amplifier stage 62C, and final amplifier stage 64C. Power control circuitry 46 remains essentially unchanged from that described earlier with FET 70C. The amplifier chain 100C has a feedback loop 106C around first amplifier stage 60C. The feedback loop 106C comprises a feedback element 108C and a switch 110C. The feedback element 108C may comprise a resistor or other impedance inducing element such as an inductor. When the switch 110C is open, the amplifier chain 100C operates as would be expected. Namely, an RF input signal 96 is amplified in first amplifier stage 60C, second amplifier stage 62C, and final amplifier stage 64C prior to being sent through a matching network and thence to the antenna 26 (FIG. 1). The switch 110C is open in a first mode of operation, such as the GMSK mode of operation wherein the amplifier stages 60C, 62C, 64C are operated in a saturated mode.

The switch 110C is closed in a second mode of operation, such as the 8-PSK mode of operation. When the switch 110C is closed, feedback loop 106C is created around the first amplifier stage 60C, thereby decreasing the gain achieved in the first amplifier stage 60C. In conjunction with the switch 110C being closed, the bias supplied by the bias network 66 (FIG. 2) is increased, and the amplifier stages 60C, 62C and 64C are operated in a linear mode rather than a saturated mode.

The embodiment of FIG. 6 differs from that of FIG. 5 in that the transistor array present in final amplifier stage 64C may be scaled dynamically. Specifically, a percentage of the transistors Q1' through QN' will be turned off. In an exemplary embodiment, twelve of forty-eight transistor cells are turned off. This may be done with mode switch 150, which when logically low keeps the full transistor array turned on, and when logically high, turns off some of the transistors in the array. Mode switch 150 may control switches (not shown) associated with resistors RB (FIG. 3) allowing bias signals to reach transistors Q, effectively turning them on and off as desired. For a full explanation of this process, reference is made to commonly owned U.S. patent application Ser. No. 09/810,009, filed Mar. 16, 2001, which is hereby incorporated by reference. By turning off some of the transistors Q1' through QN', less gain is created in final amplifier stage 64C. This will effectively increase the efficiency performance in the 8-PSK mode. In the GMSK mode, all available transistors Q1 through QN and Q1' through QN' will be used for higher gain and power.

While it should be readily apparent, common to all three embodiments is a need to dampen power somewhat between the GMSK mode and the EDGE mode to offset the increase in the bias current. This is a result of concern for noise power performance. In general, the system noise floor is expressed as follows:

Noise power calculations=−174 dBm.Hz+10 Log $BW+GAIN+NF$.

Thus, lowering the gain in the EDGE mode will lower the noise power. In the first embodiment, an entire amplifier stage (60A) is taken out of the amplification chain. The assumption is that the noise figure (NF) will increase slightly when the first amplifier stage 60A is switched out (possibly 2 dB to 3 dB). But lowering the gain by approximately 10 dB will result in an overall increase in noise performance by 7 dBm to 8 dBm (using 2 dB to 3 dB for the increase in NF). In the second embodiment, an amplifier stage (60B) has its amplification damped by the use of a feedback loop. In the third embodiment, an amplifier stage (60C) has its amplification damped by the use of a feedback loop and another amplifier stage (64C) has its amplification damped by turning off some of the amplification cells within the amplifier stage.

Those skilled in the art will recognize improvements and modifications to the preferred embodiments of the present invention. All such improvements and modifications are considered within the scope of the concepts disclosed herein and the claims that follow.

What is claimed is:

1. An amplifier chain, comprising:
    a first amplifier stage;
    a final amplifier stage in series with said first amplifier stage;
    a switch associated with said first amplifier stage;
    said first and final amplifier stages operating in a saturated mode when said switch is open; and
    said first amplifier stage being bypassed when said switch is closed and said final amplifier stage operating in a linear mode when said switch is closed.

2. The amplifier chain of claim 1 further comprising a second amplifier stage positioned serially between said first stage and said final stage.

3. The amplifier chain of claim 2 wherein said second amplifier stage operates in a saturated mode when said switch is open and a linear mode when said switch is closed.

4. The amplifier chain of claim 1 further comprising a bias circuit providing a bias current for biasing said final amplifier stage.

5. The amplifier chain of claim 4 wherein said bias current increases when said switch is closed.

6. The amplifier chain of claim 1 wherein said final amplifier stage comprises a transistor array.

7. The amplifier chain of claim 2 wherein said second amplifier stage comprises a plurality of parallel transistor cells.

8. The amplifier chain of claim 7 wherein said final amplifier stage comprises a second plurality of parallel transistor cells.

9. The amplifier chain of claim 1 wherein said switch comprises a pin diode.

10. An amplifier chain comprising:
    a first amplifier stage;
    a final amplifier stage positioned in series with said first amplifier stage;
    a feedback loop comprising a switch and a impedance element, said feedback loop associated with said first amplifier stage;
    said amplifier stages operating in a saturated mode when said switch is open; and
    said amplifier stages operating in a linear mode when said switch is closed.

11. The amplifier chain of claim 10 further comprising a second amplifier stage positioned in series between said first amplifier stage and said final amplifier stage.

12. The amplifier chain of claim 11 wherein said final amplifier stage comprises a plurality of parallel transistor cells.

13. The amplifier chain of claim 10 wherein said final amplifier stage comprises a plurality of parallel transistor cells.

14. The amplifier chain of claim 10 further comprising a bias circuit providing a bias current for basing said final amplifier stage.

15. The amplifier chain of claim 14 wherein said bias current increases when said switch is closed.

16. The amplifier chain of claim 10 wherein said amplifier chain is adapted for use in a GMSK mode when said switch is open.

17. The amplifier chain of claim 10 wherein said amplifier chain is adapted for use in an 8-PSK mode when said switch is closed.

18. The amplifier chain of claim 10 wherein said switch comprises a pin diode.

19. The amplifier chain of claim 12 wherein said plurality of transistor cells comprises forty-eight transistor cells.

20. An amplifier chain comprising:
   a first amplifier stage;
   a final amplifier stage positioned in series with said first amplifier stage;
   a switch associated with said first amplifier stage;
   said final amplifier stage comprising a plurality of transistors cells arranged in a parallel array;
   said amplifier chain operating in a first mode when said switch is open and in a second mode when said switch is closed; and
   said plurality of transistor cells all operating in said first mode and a portion of said plurality of transistor cells operating in said second mode.

21. The amplifier chain of claim 20 further comprising a second amplifier stage positioned in series between said first and said final amplifier stages.

22. The amplifier chain of claim 21 further comprising an impedance element associated with said switch, said impedance element and said switch forming a feedback loop for said first amplifier stage when said switch is closed.

23. The amplifier chain of claim 21 further comprising a bias circuit providing a bias current for each of said amplifier stages.

24. The amplifier chain of claim 23 wherein said bias circuit provides different bias currents according to the mode in which the amplifier chain is operating.

25. The amplifier chain of claim 20 wherein said amplifier chain operates in a saturated state when in said first mode.

26. The amplifier chain of claim 20 wherein said amplifier chain operates in a linear state when in said second mode.

27. The amplifier chain of claim 20 wherein said amplifier chain operates in a saturated state when in said first mode and a linear mode when in said second mode.

28. The amplifier chain of claim 20 wherein said amplifier chain operates in a GMSK mode when in said first mode.

29. The amplifier chain of claim 20 wherein said amplifier chain operates in an 8-PSK mode when in said second mode.

30. The amplifier chain of claim 20 wherein said portion of said plurality of transistor cells operating in said second mode comprises thirty-six of forty-eight transistor cells operating in said second mode.

31. A method of controlling an amplifier chain with a plurality of amplifier stages, comprising:
   providing a switch associated with a first amplifier stage in the amplifier chain;
   operating the amplifier chain in a first mode when said switch is open, said first mode comprising operating the amplifier stages in a saturated mode;
   operating the amplifier chain in a second mode when said switch is closed, said second mode comprising operating at least one of said amplifier stages in a linear mode;
   dampening gain associated with said first amplifier stage when said switch is closed; and
   increasing a bias control signal to at least one of said amplifier stages when said switch is closed.

32. The method of claim 31 wherein dampening gain associated with said first amplifier stage when said switch is closed comprises bypassing said first amplifier stage.

33. The method of claim 31 wherein dampening gain associated with said first amplifier stage when said switch is closed comprises providing a feedback loop for said first amplifier stage.

34. The method of claim 31 further comprising varying a number of amplification elements in a final amplifier stage when said switch is closed.

35. The method of claim 31 further comprising operating the amplifier chain in a GMSK mode when said switch is open.

36. The method of claim 35 further comprising operating the amplifier chain in an 8-PSK mode when said switch is closed.

* * * * *